US005189390A

United States Patent [19]

Fagard

[11] Patent Number: 5,189,390

[45] Date of Patent: Feb. 23, 1993

[54] METHOD FOR STIMULATING THE FINGER OF AN OPERATOR ACTING ON A STATIC KEYBOARD AND A DEVICE FOR IMPLEMENTING THIS METHOD

[75] Inventor: Pierre Fagard, Montigny le Bretonneux, France

[73] Assignee: Sextant Avionique, France

[21] Appl. No.: 586,645

[22] Filed: Sep. 21, 1990

[30] Foreign Application Priority Data

Sep. 22, 1989 [FR] France ............................ 89 12455

[51] Int. Cl.[5] ........................................ H03K 17/94

[52] U.S. Cl. .................................. 340/407; 341/22; 341/27

[58] Field of Search .................... 340/407; 341/27, 22

[56] References Cited

U.S. PATENT DOCUMENTS 4,362,408 12/1982 Cordes et al. ................ 340/407 X

FOREIGN PATENT DOCUMENTS 0061595 10/1982 European Pat. Off. ........... 340/407

OTHER PUBLICATIONS

IBM Technical Disclosure Bulletin, vol. 22, No. 6, "One-Hand Tactile Data Transmitter" (Nov. 1979).

IBM Technical Disclosure Bulletin, vol. 24, No. 5, "Provision of Movement and Sound in Capacitance Switch and Diaphragm Switch Keyboards" (Oct. 1981).

IBM Technical Disclosure Bulletin, vol. 24, No. 10, "Key With Electrical Tactile Feedback" (Mar. 1982).

*Primary Examiner*—Jin F. Ng

*Assistant Examiner*—Christine K. Oda

*Attorney, Agent, or Firm*—William A. Drucker

[57] ABSTRACT

A method and device for stimulating the finger of an operator acting on a static keyboard, which method consists in making at least part of the keyboard mobile on which the finger of the user bears at least partially when it actuates a key, detecting at least one component of the force exerted by the finger on the keyboard during such actuation and causing a pre-established movement of the mobile part of the keyboard when the value of this component exceeds or has exceeded a threshold value.

10 Claims, 2 Drawing Sheets

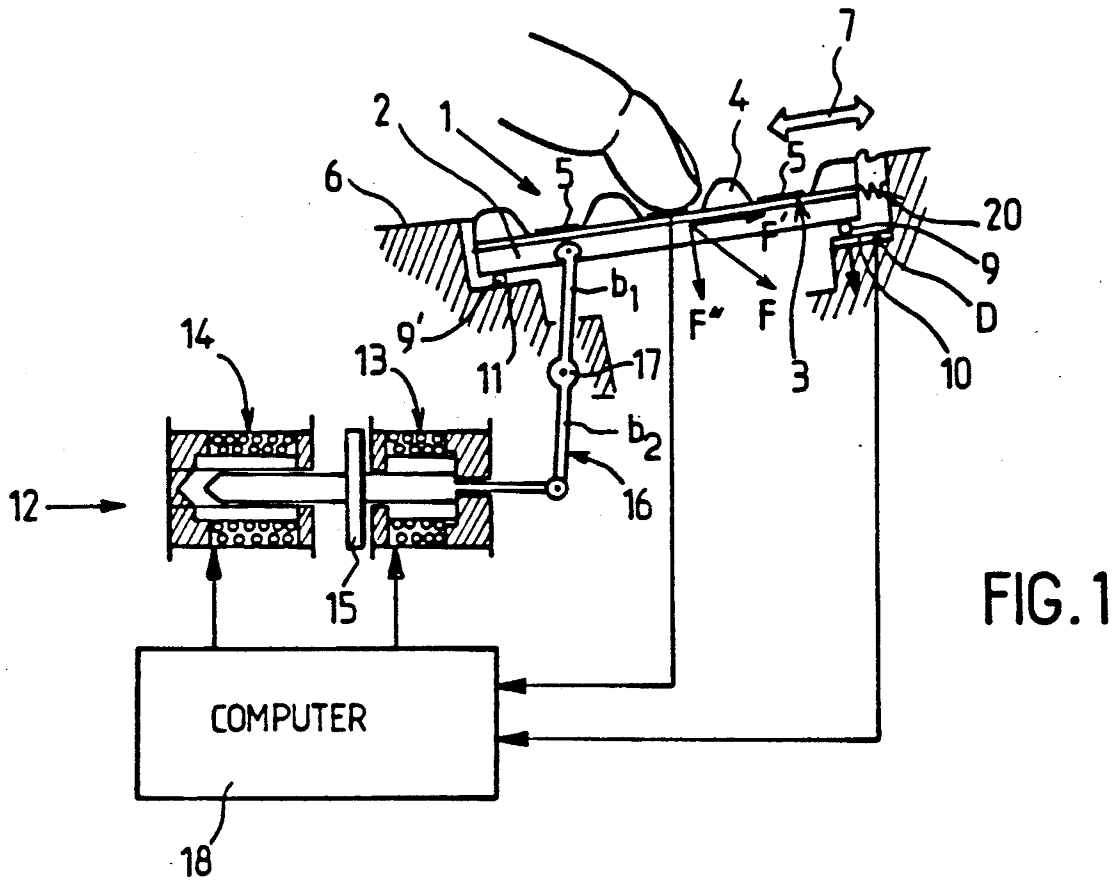
FIG. 1
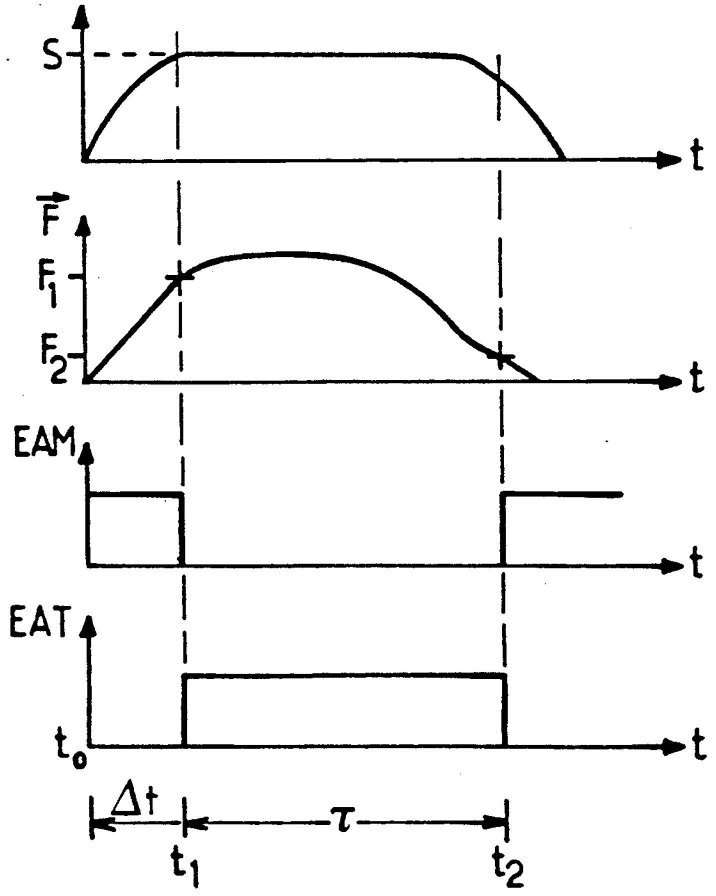
FIG. 2
FIG. 3
FIG. 4
FIG. 5

METHOD FOR STIMULATING THE FINGER OF AN OPERATOR ACTING ON A STATIC KEYBOARD AND A DEVICE FOR IMPLEMENTING THIS METHOD

BACKGROUND OF THE INVENTION

1. Field of the Invention

The present invention relates to a method of stimulation for generating a given tactile effect on the finger of a user which is acting on a key of a static keyboard, for example for re-creating a feeling of force and rupture similar to that provided by conventional push-buttons (particularly of the deformable capsule type).

It also relates to a device specially designed for implementing this method.

2. Description of the Prior Art

Generally, a static keyboard usually comprises a rigid surface possibly mounted on a force measuring system and covered with a so-called "tactile" surface for making and localizing the selections. This keyboard may further comprise a grid for guiding the bearing pressure and defining the zones forming the keys, this grid being added to the tactile surface or forming an integral part thereof.

It is clear that, because it is static, this keyboard does not make it possible to generate on the finger of the operator which is acting on a key a physiological stimulus for example for acknowledging, validating or even indicating that the desired function has been carried out or is being carried out.

This is why means have been associated with the keyboard for causing a shock or transmitting vibrations at a suitable chosen point of the keyboard which are perceptible by a finger acting on a key.

Now, it proves that this solution has a number of drawbacks:

- The amplitude of the vibrations or shocks exerted on the keyboard must be relatively low (and so practically imperceptible) so as not to disturb the operation of the keyboard and, in particular, the tactile surface.
- For this reason, these vibrations are difficult to detect by a user wearing gloves.
- When the keyboard is mounted on a structure subjected to vibrations, it becomes difficult to distinguish the vibrations triggered off by actuation of a key from the vibrations transmitted by the structure.
- This solution which is not entirely satisfactory from the ergonomic point of view does not make it possible to re-create sensations similar to that of conventional push-buttons with which users are familiar.

It has also been proposed, particularly in the Review "IBM Technical Disclosure" (Bulletin, vol 20, no. Jul. 2, 1977 New York US, pages 708-709) a method for generating a given effect on the finger of a user which is acting on a key (5) of a static keyboard, this method consisting in making at least a part (1) of the keyboard mobile on which the finger of the user bears at least partially when it actuates a key, and in causing a movement of the keyboard during such actuation. In this case, the movement is triggered by the contact caused by the actuated key.

Considering the mobility of the keyboard under the effect of actuation, this solution has in particular the drawback of requiring relatively sensitive keys which, when they are actuated, must cause switching before the assisted movement of the mobile part of the keyboard occurs, the system not having to take into account possible switching during the outgoing and return travel of the mobile part of the keyboard.

For this reason, this solution remains subject to undesirable switching, possibly due to vibrations.

SUMMARY OF THE INVENTION

The purpose of the invention is more particularly to overcome these drawbacks.

It provides a method of the type discussed above which further comprises the detection of a magnitude representative of the force exerted on the keyboard, in the direction of movement of the keys, by the finger of the user, comparison of this magnitude with a threshold value and the triggering of an assisted movement of the mobile part of the keyboard over a pre-established distance, when said magnitude exceeds or has exceeded said threshold value.

An important advantage of this solution is that it makes possible the use of static keys which are practically insensitive to vibrations. Furthermore, switching of the actuated key can only occur when the mobile part of the keyboard arrives at the end of the return travel. In this case, switching takes place cleanly, without ambiguity, under the effect of the kinetic energy of the finger acquired during the return movement of the mobile part of the keyboard. Thus, as in the preceding solution, a logic is avoided making it possible to de-activate the output of the keyboard during its movements.

Said threshold value may possibly be determined so that the movement of the mobile part begins at the moment when the switching circuit associated with the key which is actuated changes state, or even following a given period of time after such change of state, for example a period required for validating said change of state.

The method according to the invention further comprises return of the mobile part to its initial position, either after a given period $\tau$ following the change of state, or following release of the key by the operator.

Of course, a device for implementing the above described method will necessarily comprise:

- a static type keyboard comprising a plurality of keys,
- a mobile assembly including all or part of the keyboard,
- detection means for detecting at least one of the components of the stresses undergone by the keyboard following the action of an operator on the key of the keyboard,
- an actuator adapted for generating a pre-determined movement of the mobile assembly, and
- an electronic circuit for controlling the actuator as a function of the signal delivered by the detector and/or the state of the switching device associated with the key of the keyboard which has been actuated.

BRIEF DESCRIPTION OF THE DRAWINGS

Embodiments of such a device will be described hereafter by way of non limitative examples, with reference to the accompanying drawings in which:

FIG. 1 is a view of a keyboard according to the invention, in partial schematic section, as well as the electronic circuit which is associated therewith;

FIGS. 2 to 5 are diagrams showing the variation in time of the forces exerted on the mobile assembly of a keyboard of the type shown in FIG. 1, in relation with the curve of detection (FIG. 2) of the tactile surface of this keyboard, FIG. 3 showing the variation of the force F exerted by the finger of an operator on the tactile surface, whereas FIGS. 4 and 5 show the variation of the forces exerted by the holding electromagnet (FIG. 4) and by the traction electromagnet (FIG. 5);

DESCRIPTION OF THE PREFERRED EMBODIMENTS

Figure 6:
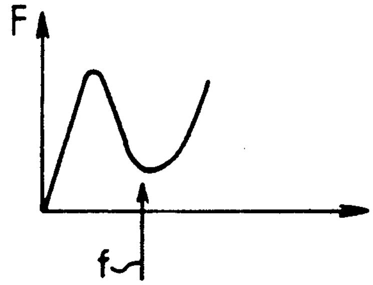
FIGS. 6 and 7 are diagrams representative of the bearing force exerted by the finger of an operator on the key of a keyboard, as a function of the stroke effected by this key, in the case of a conventional push-button (FIG. 6) and in the case of a keyboard according to the invention, with controlled tactile effect (FIG. 7)

In the example shown in FIG. 1, the keyboard comprises a mobile assembly 1 including a flat support 2 carrying a tactile surface 3 and a grid 4 for guiding the bearing forces and defining zones serving as keys 5.

It should be noted in this connection that the invention is not limited to such a structure. Thus, for example, the tactile structure could be incorporated in support 2. Furthermore, this support 2 could possibly consist of a liquid crystal cell providing re-captionable identification of keys 5.

The mobile assembly 1 is mounted on a fixed support structure 6 via guide means so as to be able to move in translation as shown by the double arrow 7, along an axis of movement parallel to the support plane 2.

In this embodiment, the guide means comprise running elements 9, 9' mounted on two respective running tracks 10, 11.

The component F" (normal to the tactile surface) of the forces F applied by the user on the keys is detected by a force detector D placed under the running track 10.

The movements of the mobile assembly 1 in the direction of the double arrow 7 are controlled by an actuator module 12 formed by a double acting electromagnet comprising a holding winding 13, a traction winding 14 and a mobile armature 15 connected to the mobile assembly 1 via a transmission device.

This transmission device comprises here a link 16 whose ends are articulated respectively to said armature 15 and to said assembly 1 and whose central portion is mounted for rocking about a fixed pin 17.

Energization of coils 13, 14 is controlled by a computer 18 which further receives information from selection localization devices associated with each key 5 and a detection signal coming from the force detector D.

Of course, the actuator 12 could be formed of two electromagnets (traction EAT and holding EAM) mounted in tandem and having mobile armatures or cores coupled mechanically together.

The purpose of actuator 12 is more particularly:

- to hold the mobile assembly 1 in the rest position as long as the selection by the computer 18 has not been effectively taken into account, opposing any movement due to a force exerted by a finger of the operator;
- to release the mobile assembly 1 and move it in the direction of force F exerted by the operator, when the selection has been taken into account by computer 18.

The operation of the above described keyboard is more particularly illustrated in FIGS. 2 to 5.

In the absence of selection of a key 5 on the keyboard (rest condition), the holding winding 13 of the actuating module 12 is supplied with power, the mobile armature 15 is in the position in which the airgap between the fixed armature associated with winding 13 and the mobile armature 15 is minimum. The retention force generated by this winding 13 is then maximum.

On the other hand, the traction winding 14 of module 12 is not supplied with power; the airgap between the fixed armature associated with this winding 14 and the mobile armature 15 is maximum and corresponds to the maximum stroke of the mobile armature 15.

At time $t_0$ the operator places his finger on a key and exerts an increasing bearing force F. In a first period $\Delta t$, computer 18 determines that the selection is not effective and so maintains the rest condition.

At a time $t_1$, the force $\bar{F}$ exerted exceeds a preprogrammed threshold $F_1$ (FIG. 3) which here corresponds to the detection threshold S of the actuated key (FIG. 2). Computer 18 then determines that the selection is effective and causes movement of the mobile assembly 1 by cutting off the power supply to the holding winding 13 and establishing the power supply to the traction winding 14. It should be noted that this procedure could also be triggered off either in response to overshooting of the detection threshold S (and consequently of the change of state of the switching circuit associated with the actuated key 5) or when a logic combination, for example of AND or OR type, of the two above mentioned triggering conditions is realized.

Energization of the traction winding 14 causes movement of the mobile armature 15 until, at the end of travel, the airgap between the fixed armature associated with winding 14 and the mobile armature 15 is minimum. This movement of the mobile armature causes a corresponding movement of the mobile assembly 1 over a distance which is equal to the product of the stroke of the mobile armature 15 multiplied by a multiplication (or de-multiplication coefficient) defined by the ratio of the lengths of the two arms $b_1$, $b_2$ of link 16.

The mobile assembly 1 is then held in this energized condition for a given period $\tau$ by computer 18, either by programming or by detection of a time $t_2$ marking the end of the period $\tau$ which corresponds to the moment when the operator releases the selected key. Such determination of time $t_2$ may be provided, either from the change of state of the switching circuit associated with the actuated key 5 or when the force detected by detector D passes below a certain threshold $F_2$ (FIG. 3).

After period $\tau$, computer 18 causes de-energization of the traction winding 14 and energization of the holding winding 13, so that the mobile assembly 1 returns to the rest position. A return spring 20 may be further provided for facilitating such return and for placing the mobile assembly 1 in the rest position, in the absence of the power supply to computer 18.

Figure 7:
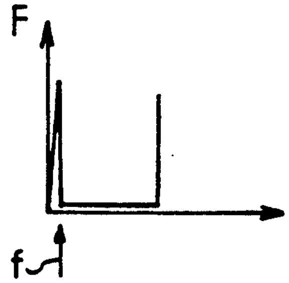

FIGS. 6 and 7 show the similarities existing between the sensations obtained by means of a keyboard according to the invention and those obtained by means of a conventional button.

In both cases, a first phase can be observed in which a considerable increase of the bearing force F exerted only generates a small movement of key 5, a second phase in which the movement (considerable) of the key is practically independent of the bearing force (which is very small, even zero) and a third phase in which, at the end of travel, increase of the bearing force F generates only a very small (even zero) movement of key 5.

In FIGS. 6 and 7, arrow f indicates the position of the travel of the key corresponding to the selection being taken into account.

In the example shown in FIG. 1, the mobile assembly 1 moves in translation along an axis parallel to the tactile surface 3, which is then preferably oriented so that the force exerted by the finger of the operator on a key 5 is oriented obliquely with respect to said movement axis. Thus, the force F has, in the plane of the tactile surface 3, a component F′ tending to bring the mobile assembly 1 to the energized condition, against the action exerted by spring 20 and the attraction due to energization of the holding winding 13. With these features, it becomes possible to conveniently adjust the tactile effect generated by the keyboard on the finger of the operator.

Of course, the invention is not limited to the above described embodiment.

Figure 8:
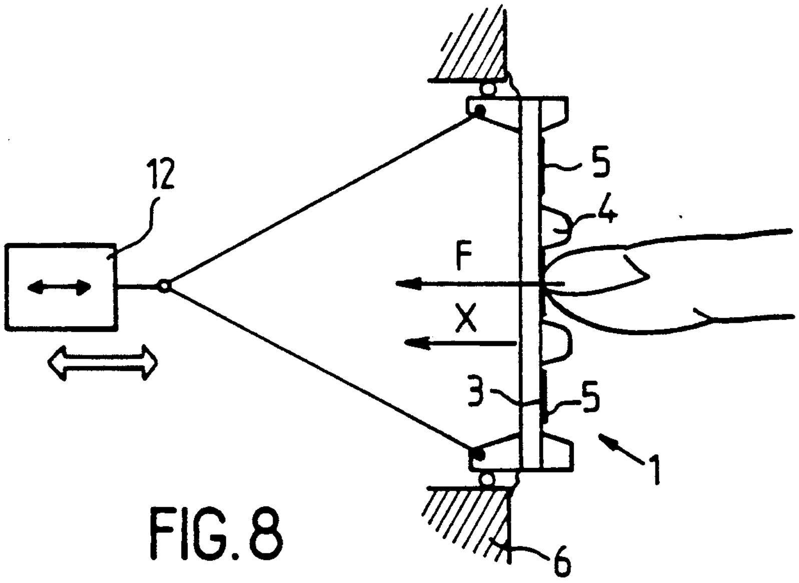
FIG. 8 is a schematic representation illustrating a variant of the keyboard in which the movement of the mobile assembly takes place perpendicularly to the tactile surface.

Thus, the mobile assembly 1 could be mounted on the fixed structure 6 in the way shown in FIG. 8, so that it moves in translation along an axis X perpendicular to the tactile surface 3 and, preferably, parallel to the bearing force F exerted by the finger of the user. The actuation module 12 is then designed so as to cause translation of the mobile assembly 1 along said movement axis X and in accordance with the above defined sequence, so as to restore the feeling of a push-button which yields when pressed.

What is claimed is:

1. A stimulation method for generating a given tactile effect on a finger of a user which exerts a force in an actuation direction on a static keyboard including a plurality of static keys, said method consisting in making said keyboard mobile in a determined direction and in causing an assisted movement of the keyboard in said determined direction while said force is exerted, which method further comprises the following steps:

detecting a magnitude representative of a component of said force in said actuation direction, comparing said magnitude with a threshold value, holding immobile said keyboard when said magnitude is lower than said threshold value, controlling said assisted movement over a preestablished distance, when said magnitude exceeds said threshold value.

2. The method as claimed in claim 1, wherein the threshold value is determined so that the assisted movement of the keyboard begins at the moment of a change of state of a switching circuit associated with said static keys.

3. The method as claimed in claim 1, wherein the threshold value is determined so that said assisted movement begins after a given period of time following the change of state of a switching circuit associated with said static keys.

4. The method as claimed in claim 1, further comprising return of the keyboard to an initial position, either after a given period following the change of state of a switching circuit associated with one of said static keys or following release of said keyboard by the user.

5. The method as claimed in claim 1, wherein said keyboard is disposed so that said force is oriented obliquely with respect to said determined direction.

6. A keyboard comprising a plurality of static keys mounted on a mobile support element, an actuator linked to said element so as to generate thereto a predetermined movement, and an electronic control circuit for controlling the actuator, said keyboard further comprising means for detecting a component of a stress exerted on the mobile support element by a user in a determined actuation direction and for delivering a detection signal representative of said component, said electronic control circuit comprising means for comparing said detection signal with a reference signal representative of a threshold value and means for controlling the actuator so as to cause said predetermined movement of the mobile support element, once the detection signal has reached said threshold value, wherein the mobile support element comprises a tactile surface on which the static keys are formed, said mobile support element being movable in translation along a translational axis parallel to the tactile surface.

7. The keyboard as claimed in claim 6, wherein said actuator is formed by a double acting electromagnet comprising a holding winding, a traction winding and a mobile armature connected to the mobile support element via a transmission device.

8. The keyboard as claimed in claim 7, wherein the transmission device consists of a link provided with two arms connected together in a central region and having two respective ends articulated respectively to the mobile armature and to the mobile support element, said central region being mounted for rocking about a fixed pin.

9. The keyboard as claimed in claim 6, wherein said mobile support element is movable in translation on a fixed support structure via running elements mounted on two respective running tracks.

10. The keyboard as claimed in claim 9, wherein one at least of the running tracks is equipped with a force detector coupled to said electronic control circuit.

* * * * *